United States Patent [19]

De La Moneda

[11] 4,149,906
[45] Apr. 17, 1979

[54] PROCESS FOR FABRICATION OF MERGED TRANSISTOR LOGIC (MTL) CELLS

[75] Inventor: Francisco H. De La Moneda, Reston, Va.

[73] Assignee: International Business Machines Corporation, Armonk, N.Y.

[21] Appl. No.: 792,277

[22] Filed: Apr. 29, 1977

[51] Int. Cl.² ............... H01L 21/265; H01L 27/02; H01L 21/22

[52] U.S. Cl. .................. 148/1.5; 148/187; 357/34; 357/91; 357/92

[58] Field of Search ............ 148/1.5, 187; 357/92, 357/91, 34

[56] References Cited

U.S. PATENT DOCUMENTS

| | | | |
|---|---|---|---|
| 3,873,383 | 3/1975 | Kooi | 148/187 |
| 3,909,307 | 8/1975 | Stein | 148/1.5 |
| 4,043,849 | 8/1977 | Kraft et al. | 148/187 |
| 4,045,251 | 8/1977 | Graul et al. | 148/1.5 |
| 4,075,039 | 2/1978 | Sloan, Jr. | 148/1.5 |
| 4,076,556 | 2/1978 | Agras-Guerna et al. | 148/1.5 |

OTHER PUBLICATIONS

Tomisawa et al., "Vertical Injection Logic", IEEE, Solid St. Circuit, vol. SC-11, (1976) 637.

Mulder et al., "High Speed I²L", IEEE, Solid St. Circuit, vol. SC-11, (1976) 379.

McGreivy et al., "Up-Diffused I²L — — — ", Int.ⁿ Electron Device Meeting, IEEE, Wash. D.C., Dec. 1976, p. 308.

Chang et al., "— — — Bipolar — — — Oxide & Diffused Isolation — — —".
Ibid, p. 577, Dec. 1975.

*Primary Examiner*—L. Dewayne Rutledge
*Assistant Examiner*—Upendra Roy
*Attorney, Agent, or Firm*—John E. Hoel

[57] ABSTRACT

A method is disclosed to fabricate a Merged Transistor Logic (MTL) cell having vertical devices with higher beta and $f_T$, and a lateral device with higher beta than available from conventionally fabricated cells. Features which contribute to these results include a p-type epitaxial layer, highly doped emitter and collector regions for the lateral PNP transistor, a contour for the base region of the lateral PNP which reinforces its transistor action in the bulk rather than at the surface of the epitaxial layer, a highly doped emitter for the vertical device, a uniform doping profile for the base region of the vertical device, dielectric isolation, and the use of heavily doped base regions to reduce injection of emitter current into inactive regions of the cell.

2 Claims, 12 Drawing Figures

PROCESS FOR FABRICATION OF MERGED TRANSISTOR LOGIC (MTL) CELLS

FIELD OF THE INVENTION

The invention disclosed relates to semiconductor devices and more particularly relates to MTL cells and methods for their fabrication.

BACKGROUND OF THE INVENTION

Merged Transistor Logic (MTL) exhibits many appealing features such as excellent speed-power products, small cell size, low number of masks and diffusion steps. FIG. 1A shows a cross-sectional view of an MTL cell fabricated using a conventional bipolar process. The conventional bipolar process comprises the following steps. First, a low doped n-type epitaxial layer 7 is grown on an n+ surface which serves as a common emitter to all vertical NPNs. A guard ring 4 is then driven in, preferably deep enough to contact the n+ surface. Next, a p-type diffusion forms region 8 for the emitter of the lateral PNP device and region 10 for the collector and base of the PNP and vertical NPN, respectively. A final n+ diffusion is used to form the collectors of the vertical devices. Obviously, this process also yields conventional vertical NPN devices. The lateral PNP device is biased to function as a current source to drive the vertical NPN device and charge capacitances during switching transients. The electrical parameters of importance to the switching performance of the vertical device are its current gain and switching frequency, $f_T$. For the lateral device, only beta is important since it is always in a conduction state. It is well known that the switching performance of MTL cells fabricated by conventional bipolar processing is limited by their typically low beta and $f_T$ owing to inappropriate doping profiles. A listing of the features sought in a high performance switching bipolar device will help to identify the inadequacies of the conventional MTL cells.

(1) The active collector area should be large relative to the active emitter area to minimize recombination in the extrinsic or inactive base region.

(2) The ratio of emitter doping density to base doping should be large to insure that the current flowing across the emitter-base junction is mainly made up of one type of carriers; namely, the emitter majority carriers injected into the base. This leads to an injection efficiency close to unity and high beta. However, emitter doping larger than $5 \cdot 10^{20}$ cm$^{-3}$ is detrimental to high betas, as discussed by R. P. Mertens, H. J. DeMan and R. J. Van Overstraeten in "Calculation of the Emitter Efficiency of Bipolar Transistor," *IEEE Trans. Elect. Dev.*, September 1973.

(3) It is also shown in the above cited article by R. P. Mertens, et al., that compensation of emitter donor impurities by base acceptor impurities is also detrimental to obtaining high betas.

(4) The emitter-base junction should have a steep doping profile like that of an abrupt junction to minimize minority carrier storage within the emitter junction and associated emitter storage capacitance and hence increase $f_T$.

(5) The base doping profile should decrease from emitter to collector so that an aiding electric field is set up which reduces the transit time of injected carriers across the base region for larger $f_T$.

(6) The base doping outside the active base region should be high to reduce the extrinsic base resistance, $R_B$, and thereby minimize debiasing of the emitter-base junction and reduce RC time constants.

(7) The collector doping should be high to reduce parasitic collector resistance and stop the widening of the base region at high current densities, which prematurely reduces $f_T$ as discussed by Kirk in "A Theory of Transistor Cutoff Frequency ($f_T$) Fall-Off at High Current Density," *IRE Trans. Electron Dev.*, 1962. The associated high collector capacitance is of no consequence for MTL circuits since they have no resistor collector load and their voltage swings are small.

After axamination of the structure of FIG. 1A, it becomes apparent that both its vertical and lateral devices possess few of the features listed above. The following deficiencies are noted:

(1) For the vertical device, the area of collectors $V_{01}$ and $V_{02}$ is smaller than the area of the emitter 7 and consequently do not collect the minority carriers injected by the emitter sections located between collectors which are lost through recombination. This recombination current effectively diminishes the vertical beta. Since the use of a single emitter 7 contributes to the high packing density of MTL, a reversal of this unfavorable area ratio is not feasible.

(2) The epitaxial layer 7 forming the emitter junction of the vertical device is lightly doped so that its injection efficiency is low and storage capacitance is high. In the article by F. M. Klaassen, "Device Physics of Integrated Injection Logic", *IEEE Trans. Elect. Dev.*, March 1975, formulas have been derived for the vertical beta and $f_T$ which show that the epitaxial layer 7 should be thin and highly doped for best performance.

(3) The epitaxial layer 7 doping is compensated by the diffusion of the base region 10 doping impurities which is detrimental to the injection efficiency according to the aforementioned article by R. P. Mertens, et al.

(4) The doping of the extrinsic base region of the vertical device is the same as and determined by the doping of its active base region. Since the latter must be relatively low in order to have high injection efficiency, $R_B$ is generally high.

(5) The doping of the emitter 8 of the lateral device is not in the optimum $10^{20}$ cm$^{-3}$ range since it is fabricated simultaneously with the base 10 of the vertical device to a doping level in the $10^{17}$ cm$^{-3}$ range dictated by the requirements of high vertical beta and compensation of the doping impurities of the base 10 by the subsequent diffusion of vertical collectors $V_{01}$ and $V_{02}$.

(6) The base 10 doping profile of the vertical device increases from emitter 7 to collectors $V_{01}$ and $V_{02}$, just the opposite of the fifth feature listed above.

Moreover, the cell of FIG. 1A suffers from significant recombination losses in its non-active regions which decrease the beta of the lateral device. The n+ guard ring 4 reduces the loss of holes injected through the outer sidewall 5 of the lateral emitter 8. However, hole injection through the bottom p-n− junction significantly reduces the lateral beta. Hole losses also take place through surface recombination since the injection efficiency of the emitter 8 is best near the surface where its doping concentration peaks. The leakage current from these hole losses decrease the base current drive and the number of vertical devices that can be driven from a single lateral PNP with a resulting decrease in circuit density. These leakage currents also increase the power dissipation of the cell.

OBJECTS OF THE INVENTION

It is therefore an object of the invention to provide a method to fabricate MTL cells whose vertical and lateral devices have doping profiles appropriate for high performance operation.

It is still another object of the invention to provide MTL cells whose vertical and lateral devices have improved emitter efficiency.

It is still another object of the invention to produce MTL cells having reduced recombination losses in the non-active regions of the structure.

It is still another object of the invention to decrease the power delay product of MTL logic circuits by increasing beta, $f_T$ and reducing leakage currents.

SUMMARY OF THE INVENTION

These and other objects, features and advantages of the invention are accomplished by the MTL cell structure and methods for its fabrication disclosed herein. The MTL cell of this invention comprises a substrate of a first conductivity type and a first doping concentration over which an epitaxial layer of a second conductivity type and a second doping concentration is formed. A first region of the first conductivity type is formed in the epitaxial layer which extends to the substrate. At least one second region of the first conductivity type is formed in the epitaxial layer and separate from the first region and the substrate. A third region of the second conductivity type is formed outside the first and second regions to increase the doping concentration of the epitaxial layer therein. A vertical NPN transistor and a lateral transistor of complementary conductivity are thereby formed. There results an MTL cell having reduced recombination losses, higher betas and $f_T$ which can be used to implement logic functions at faster switching rates, lower power and higher circuit packing density than has been available in the prior art.

DESCRIPTION OF THE FIGURES

These and other objects, features and advantages of the invention will be more particularly appreciated with respect to the accompanying figures.

FIGS. 2 and 3 are cross-sectional views showing some of the steps of the second technique of the invention for fabricating an MTL cell.

FIG. 2 shows the cell structure after formation of the base region of the lateral PNP transistor.

FIGS. 4 through 8A are cross-sectional views showing the steps of the third technique of the invention for fabricating MTL cells.

FIG. 4 shows the structure after a blanket p-type ion-implantation forms buried layers in the epitaxial layer.

FIG. 5 shows the structure after formation of a thick oxide over the implanted regions of the epitaxial layer and spreading of implant.

FIG. 6 shows the structure after formation of the base region of the lateral PNP transistor.

FIG. 7 shows the structure after formation of the collector regions of the vertical NPN transistor.

FIG. 8A shows the finished cell structure.

DISCUSSION OF THE PREFERRED EMBODIMENT

Figure 1A:
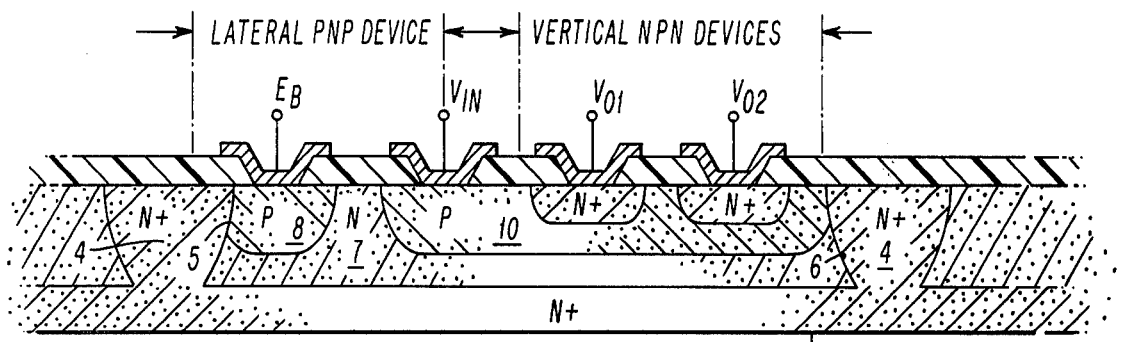
FIG. 1A is a cross-sectional view of a conventional MTL cell with an n+ guard ring to limit hole recombination losses.

From the foregoing, it may be concluded that the beta of both the lateral and vertical devices of FIG. 1A can be improved by eliminating the low-doped epitaxial regions underneath the p-diffusions. One obvious way to achieve this is to drive the p-diffusion deeper to meet the n+ substrate. However, if this p-n+ junction also forms the base-collector region of conventional vertical bipolars—emitter on top of collector—integrated with MTL cells on the same chip, the increased capacitance and lower breakdown voltage of their collector will be intolerable. Thus, the improvements of MTL cells obtained by minor modifications of the conventional bipolar process are gained at the expense of some of the electrical parameters of the conventional bipolar devices. Another alternative is to free the MTL cell structure from the constraints imposed by conventional processes and instead use processes specifically designed to yield vertical and lateral devices superior to those of conventional cells. Such fabrication processes are described next.

Figure 2:
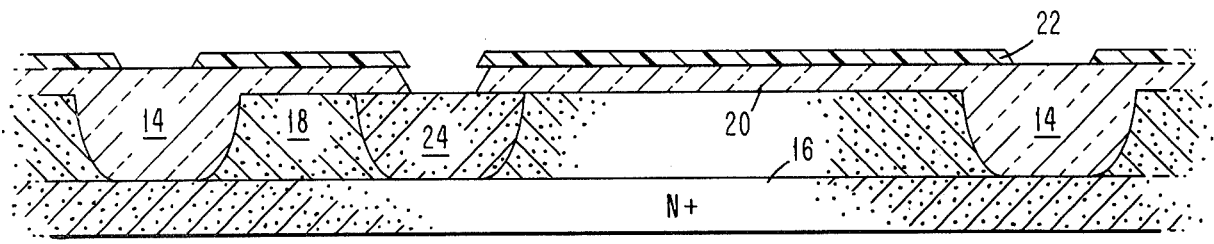

Fabrication of High Performance MTL Cell:

(1) Start with an n+ substrate 16 in FIG. 2. For optimum beta, its concentration should not exceed $1 \cdot 10^{20}$ cm$^{-3}$.

(2) Deposit by epitaxy a p-type layer 18 suitably doped in the $10^{16}$ to $10^{17}$ cm$^{-3}$ range and from 0.8 to 1.5 micron thick.

(3) Grow about 2000Å of thermal oxide, $SiO_2$, layer 20.

(4) Deposit 2000Å of silicon nitride, $Si_3N_4$, layer 22.

Mask #1

Figure 1B:
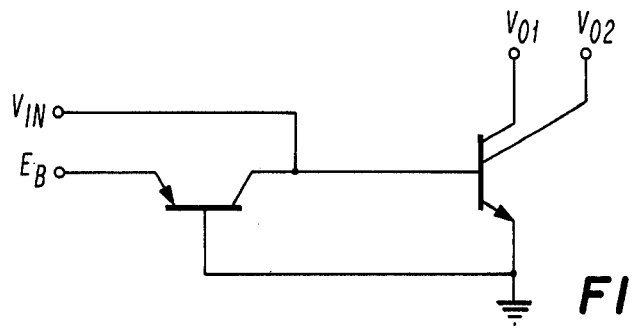
FIG. 1B is the equivalent circuit schematic for the cell of FIG. 1A.

(5) Use mask #1 to define a boundary where the subsequent etching and oxidation operations will form an oxide isolation ring 14 surrounding the MTL cell as shown in FIG. 2. This ring is equivalent to the n+ ring of FIG. 1. Etch nitride layer 22 using plasma etching. Dip in buffered HF to etch exposed regions of oxide layer 20. Etch exposed area of silicon 18 with a mixture of HF and $HNO_3$. Follow with localized thermal oxidation reaching into n+ substrate and even with the surface of the surrounding oxide layer 20.

Mask #2

(6) With conventional photolithographic techniques, mask #2 defines window 21 for the base region 24 of the lateral PNP in FIG. 2. After plasma etching this window through nitride layer 22 and oxide layer 20, a source of n-type impurities is predeposited by thermal means or ion-implantation. These impurities are thermally driven to form region 24 which extends down to the substrate 16 and has a surface doping concentration in the $10^{17}$ to $10^{18}$ cm$^{-3}$ range. If ion-implantation is used to predeposit the impurity source, layer 20 is not etched in order to reduce channeling of the implanted ions and their cut-diffusion through window 21 during the drive-in cycle.

Mask #3

Figure 3A:
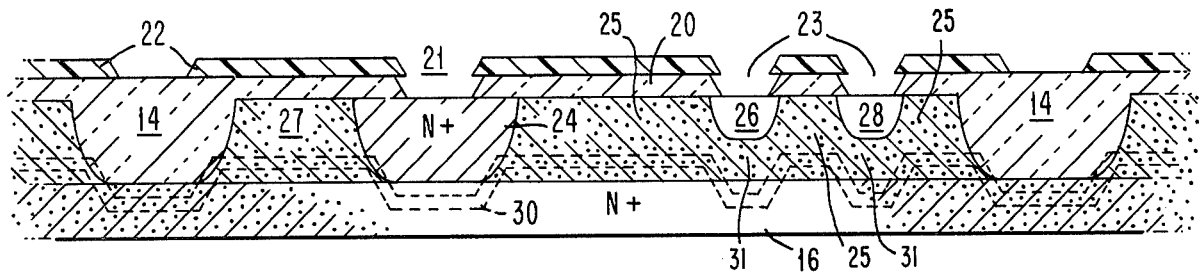
FIG. 3A shows the state of the structure after a blanket p-type ion-implantation operation.

(7) Mask #3 is used with same photolithographic and etching process of step 6 to open windows 23 for the fabrication of the collector regions 26 and 28 and definition of the active base regions 31 as illustrated in FIG. 3A. N-type impurities are predeposited through these windows and driven in by a thermal cycle tailored to yield the desired width for the base regions 31 and a surface doping density in the $10^{18}$–$10^{19}$ cm$^{-3}$ range. The doping impurities are predeposited by the same means given in step 6.

With this step, the fabrication of the regions constituting the lateral and vertical devices is complete. Their doping profiles have some of the features needed for superior devices; namely, the emitter of the vertical unit is highly doped with respect to the epitaxial base and has a near abrupt junction. The corresponding injection efficiency is high; however, this does not imply increased beta because of the loss of injected minority carriers in the inactive base regions, 25, of the vertical device. Moreover, the emitter of the lateral PNP device is not highly doped. To correct for these deficiencies and realize other advantageous features, the doping profile of the p-type epitaxial layer 18 is suitably increased as described in step 8.

(8) The objective of this step is to selectively increase the doping concentration of those regions of the epitaxial layer surrounding the active base region of the lateral device, 24, and of the vertical devices, 31, with a p-type implanted buried layer. Several alternative techniques are proposed to mask these base regions and thus localize the implant.

A first technique is suited for high circuit density applications calling for the narrowest possible linewidths. It employs the lift-off technique of Hatzakis as used by F. H. De La Moneda in United States Patent Application Ser. No. 701,375, filed June 30, 1976, entitled "Method to Fabricate Ion-Implanted Layers with Abrupt Edges." With this method, the masking used to localize the implant is defined during the preceding implantation of the collector regions 26 and 28 and consequently the p-type implant is self-aligned with respect to the collector edges so that the inter-collector spacing is as narrow as photolithography permits since no tolerances are needed to avoid implanting the base regions 31.

A second technique takes advantage of the fact that the windows 21 and 23 are registered with respect to the regions which are not to be implanted. Thus, a blanket implant will produce a buried layer whose shallow sections are self-aligned with respect to regions 24 and 31. By judicious selection of the thickness of layers 20 and 23 and implant energy, the deepest sections of the implant, 30, can be buried below the interface between the epitaxial layer 18 and the substrate 16 while the remaining shallow sections, 29, will be buried above it and increase the doping concentration outside regions 24 and 31 as depicted by the dashed lines of FIG. 3B. To increase the differential in depth between the deep and shallow sections, so that doping of regions 24 and 31 by a subsequent diffusion of layer 30 is minimized, any oxide layer left covering windows 21 and 23 from steps 6 and 7 should be etched by dipping in buffered HF. Moreover, the dosage should be sufficiently low to avoid excessive compensation of the n-type substrate 16 which degrades beta as pointed out earlier. For instance, a boron dosage of $10^{14}$ ion-cm$^{-2}$ at 600 kev will implant layers 29 at a depth of 7000Å in a 0.8 micrometer-thick one-ohm-cm epitaxial layer. The implanted ions will penetrate about 5000Å deeper and into the substrate region to form layers 30 under the base regions 24 and 31 corresponding to the removed 2000Å of oxide layer 20 and the equivalent oxide thickness of 3000Å of the removed portion of nitride layer 22. The latter is due to the fact that silicon nitride is 1.5 times denser than silicon oxide.

Figure 3B:
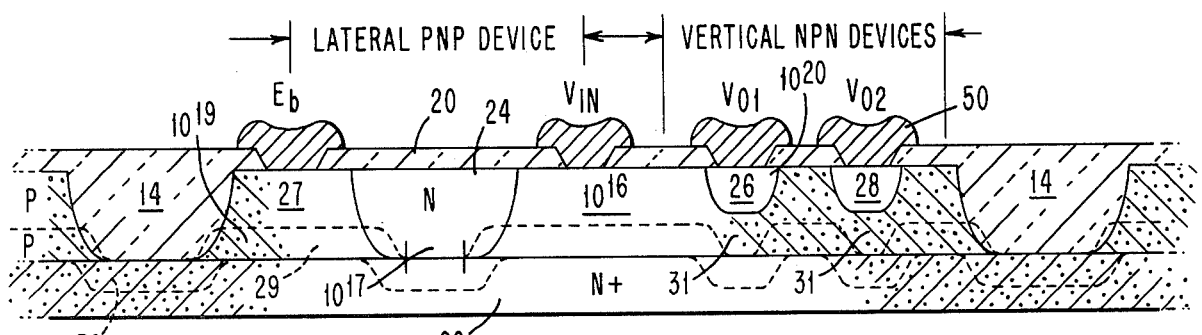
FIG. 3B shows the final structure after heat treatment.

The last operation of this step 8 is to subject the structure of FIG. 3A to a thermal cycle in an oxidizing atmosphere to activate, anneal and redistribute the doping impurities of layers 29 and 30, as shown in FIG. 3B, and to simultaneously regrow oxide in windows 21 and 23. These impurities diffuse away from the peak of the implant so that a higher doping concentration is obtained for those regions of the epitaxial layer contiguous to layers 29 and, in particular, for the emitter region, 27, of the lateral PNP. The unimplanted regions 24 and 31 are exposed to the lateral and upward diffusion of layers 29 and 30, respectively. The lateral diffusion of layers 29 narrows the width of the base region 24 and reduces the area of the base regions 31. The narrowing of basewidth of region 24 in higher beta for the lateral PNP and the reduction of the area of base regions 31 can be compensated for by enlarging the size of the windows 23. Increase in the doping concentration of regions 24 and 31 by the upward diffusion of impurities from layers 30 is practically eliminated by making layers 20 and 22 sufficiently thick as explained earlier. For the implant and structural specifications given therein, a one-hour thermal cycle at 1050° C. will spread said implant over a 5000Å range and grow about 1000Å oxide layer in the openings 21 and 23. To avoid a comparable spread of the collector regions 26 and 28, a slow diffusion impurity such as arsenic must be chosen for its fabrication. Having selectively increased the doping concentration of the epitaxial layer 18 as intended, a dip etching in warm phosphoric acid is then utilized to strip nitride layer 22 and thus prepare the structure for the concluding steps of contact opening and metallization to be described hereinafter.

A third alternative technique reverses the order of steps 6, 7 and 8; that is, first, the p-type buried layer is implanted and then the base region 24 and collector regions 26 and 28 are formed. The substitute processing steps are intended to yield doping concentrations comparable to those obtained by the second technique. They are described in what follows.

Figure 4:
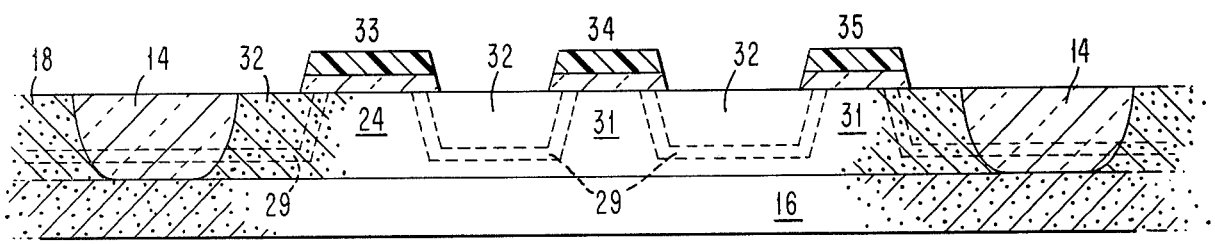

After growth of the oxide isolation ring 14 in step 5, mask #2 is used with conventional photolithography to delineate those regions 32 of the epitaxial layer in FIG. 4 whose doping concentration is to be increased. Then, those portions of layers 20 and 22 overlying regions 32 are stripped away by plasma etching. The remaining portions, 33, 34 and 35 are intended to be used as implantation and oxidation masks during subsequent operations. In order to be effective implantation masks, the thickness of the composite layers 33, 34 and 35 must be capable of blocking an implant whose energy is chosen to bury layers 29 in the epitaxial layer 18, close to its interface with the substrate 16, as in step 8. For instance, for a 1.2-micrometer thick layer 18 and a boron dosage of $10^{15}$ ion-cm$^{-2}$ at 350 kev, a combination of 3000Å of oxide and 5000Å of nitride is sufficient to mask regions 24 and 31 and obtain buried layers 29 about 3000Å above the interface. With this third technique, buried layers 29 are not only self-aligned with respect to the base regions 24 and 31 but also higher dosage levels can be used since the implant does not reach into the substrate 16.

Figure 5:
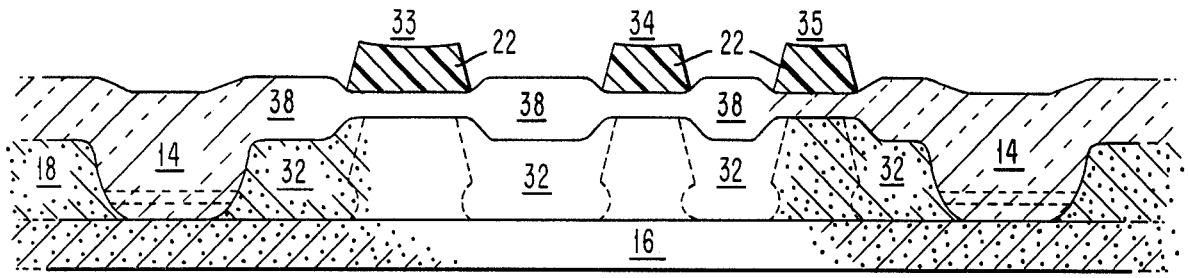

Next, damage due to ion bombardment is annealed and the implanted impurities are activated and redistributed by a thermal oxidation cycle which also has the purpose of growing a thick oxide layer, 38, over the exposed surfaces of the structure as shown in FIG. 5. This localized oxide growth is made possible by the impermeability of the nitride layer 22 which prevents oxide growth underneath it. During this thermal cycle, the impurities of layer 29 spread throughout regions 32 of the epitaxial layer thereby increasing the doping concentration of those regions. Although in FIG. 5 this spread is shown to range from the surface of layer 18 down to the substrate 16. It may also be partially carried out during this cycle and completed over the remaining high temperature cycles.

Figure 6:
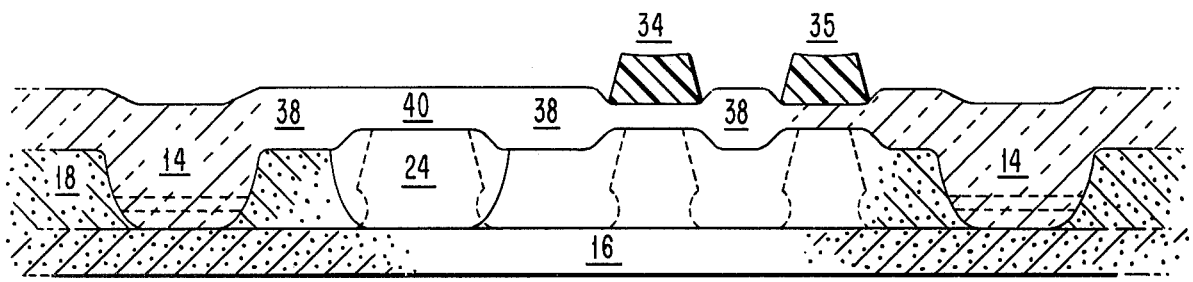

A third masking operation is next done using conventional photolithography to confine a plasma etching operation to the removal of layer 33 and the opening of a window for the predeposition therethrough of n-type impurities. Thereafter, these impurties are driven in so that they reach the substrate and form the base region 24. FIG. 6 shows the structure at this stage of the process with base region 24 and an overlying thick oxide layer 40 grown simultaneously during the drive-in cycle. Layer 40 must be sufficiently thick to prevent exposure of region 24 by the next step which consists of successive dip etchings in warm phosphoric and hydrofluoric acids to respectively remove the nitride and oxide layers of regions 34 and 35 and open windows therein.

Figure 7:
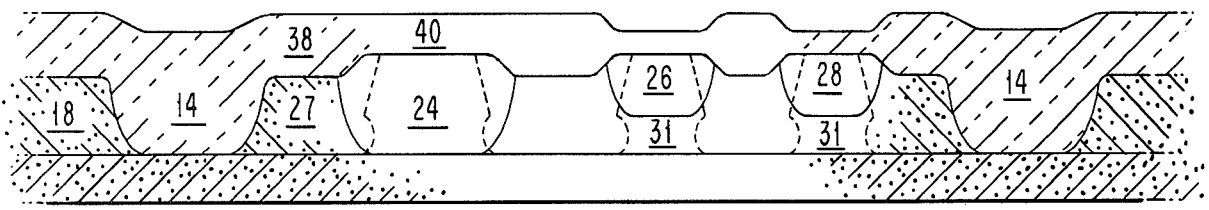

The collector regions 26 and 28 and base regions 31 are then formed as described earlier in step 7. The corresponding cross-sectional view is shown in FIG. 7. The structure is now ready for contact opening and metallization using masks and operations which apply equally well to the second technique. These processing steps are:

Mask #4

Figure 8A:
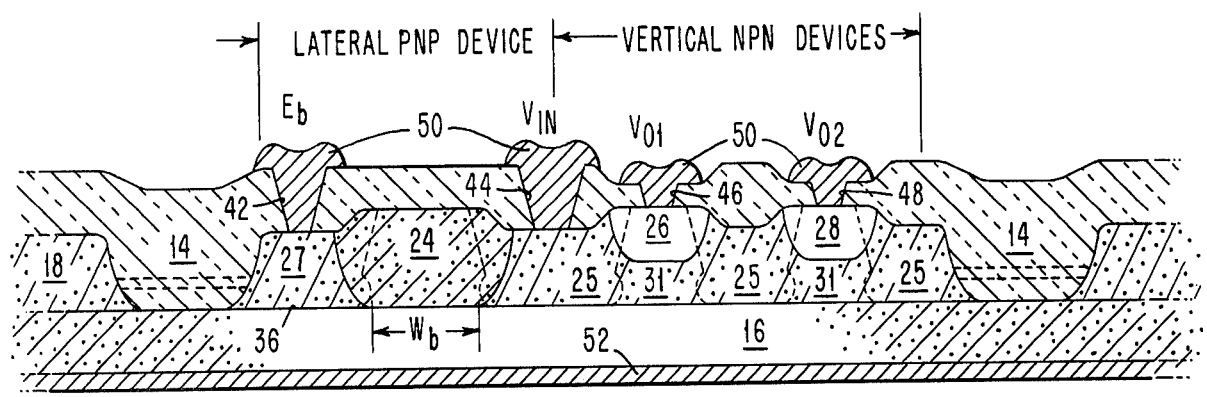

(9) Use mask #4 in conjunction with conventional photolithographic and etching techniques to form contact openings 42, 44, 46 and 48 to expose the PNP emitter region 27, PNP collector-NPN base region 25, and NPN collector regions 26 and 28, respectively. These are shown in FIG. 8A.

Mask #5

(10) After deposition of an aluminum film, mask #5 is used to delineate interconnection patterns between contact openings and input-output pads. A substractive etch is then used to remove the undesired portions of aluminum and the interconnection pattern 50 remains. After the aluminum has been etched away, the structure is subjected to an alloying operation to establish good ohmic contacts to openings 42, 44, 46 and 48. This completes the fabrication of the MTL structure shown in FIGS. 3B and 8A. A backside contact 52 can be made to the substrate 16 by conventional means, to supply the substrate voltage.

Figure 8B:
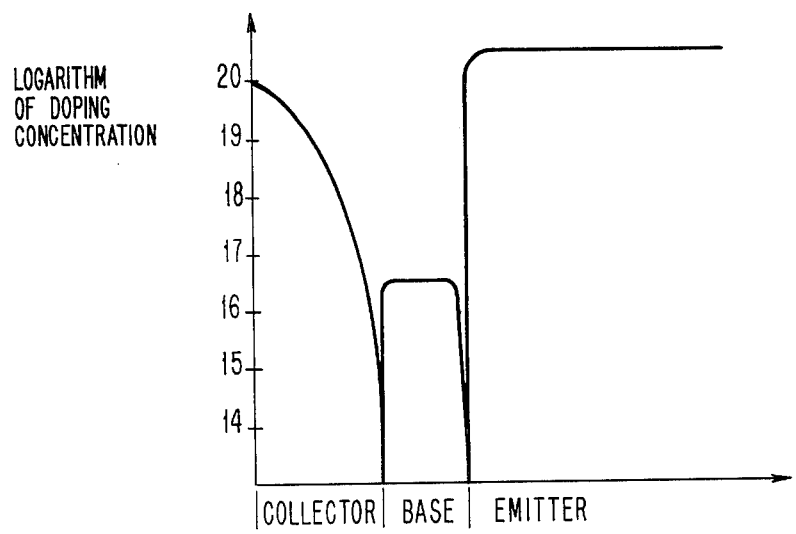
FIG. 8B shows the doping profile for the vertical device of FIG. 8A.

The doping concentrations and profiles of the finished MTL structure are examined below to show the improvement in beta for both types of devices, $f_T$ for the vertical device and reduced leakage currents. The doping profile for the vertical devices of FIGS. 3B and 8A is shown in FIG. 8B.

(1) The common emitter region 16 of the vertical device is highly doped relative to the active base regions 31 so that the injected electron current is large relative to the hole current since they are inversely proportional to the doping concentration of the base and emitter, respectively. In short, the emitter efficiency of the vertical devices are near unity. Moreover, the abrupt junction formed by the n+ substrate and the p-type epitaxial layer result in reduced emitter storage capacitance and higher $f_T$.

(2) The emitter 27 of the lateral device is highly doped which inproves its injection efficiency. Additional improvements to the lateral transistor beta are obtained from the doping profiles and geometry of its emitter and base. The doping concentration of the diffused base 24 decreases toward the substrate as the emitter 27 reaches its peak concentration corresponding to the peak of the p-type implant. Injection efficiency is then highest in the bulk making beta less sensitive to surface recombination losses. This is reinforced by the truncated pyramidal shape of the base region, with the narrowest basewidth, $W_b$, in the bulk, see FIGS. 3B and 8A.

(3) The increased doping concentration of the inactive base regions, 25, reduce the density of the electron current injected by the emitter into region 25 from its level in the active base regions 31. Thus, because of this current blocking action by the implanted p-type layers, a smaller fraction of the total emitter current is lost through recombination in regions 25 which, in turn, further increases the vertical beta. For the lateral device, the n+ substrate blocks hole injection through the bottom portion 36 of the emitter, 27, for a corresponding increase of the lateral beta.

(4) The p-type region, 25, between vertical collectors 26 and 28 which form the extrinsic base of the vertical device are highly doped so that the base resistance $R_B$ is reduced. Therefore, the debiasing of those emitter-base regions located farthest from the PNP is avoided and the number of devices that can be driven by a single PNP is then mainly determined by its beta.

Figure 1C:
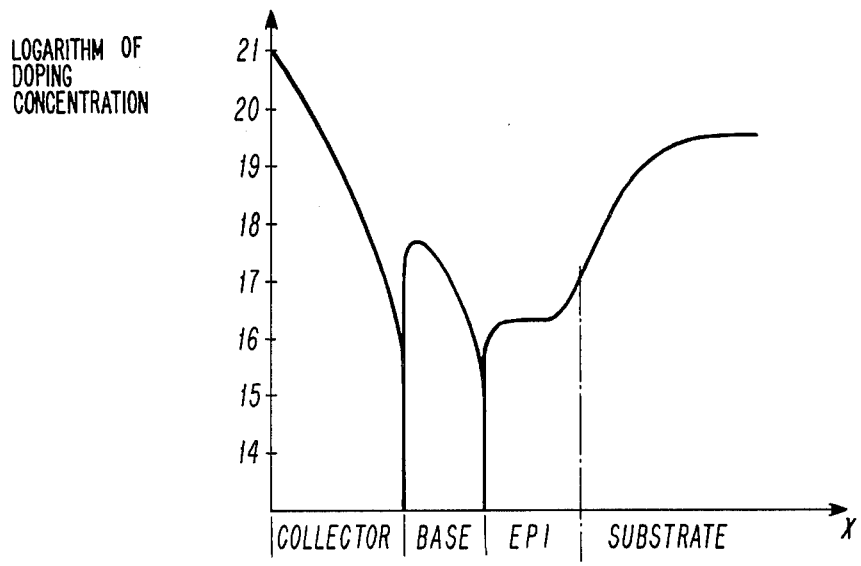
FIG. 1C is the doping profile for the vertical device of the cell of FIG. 1A.

(5) The profile of the active base of the vertical device is uniform which, although it is not ideal, is an improvement over a base profile increasing from emitter to collector as is the case of FIG. 1C.

In summary, two fabrication processes have been described which yield a structure for MTL cells whose vertical and lateral devices have impurity profiles and doping levels appropriate for high performance operation. In addition, leakage currents due to injection of emitter current into the inactive regions of the cell have been reduced. Both type of devices have high emitter efficiency, low emitter storage capacitance, and low base and collector resistance. The geometry and doping profile of the lateral device reinforce transistor action in the bulk so that the degradation of its beta due to surface recombination is avoided. Both fabrication processes use as many masks as conventional processes and their self-aligning feature imply the elimination of area consuming tolerances. Using these processes will broaden the range of applications of MTL into both the low cost and high performance fields. Reduced extrinsic base resistance and higher betas facilitate the higher circuit density needed in low cost applications. This combined with higher $f_T$ for the vertical device will make MTL meet specifications for high performance operation.

While the invention has been particularly shown and described with reference to the preferred embodiments thereof, it will be understood by those skilled in the art that the foregoing and other changes in form and details may be made therein without departing from the spirit and scope of the invention.

I claim:

1. In a process for fabricating a semiconductor device having localized regions of high and low injection efficiency, including the steps of selecting a semiconductor substrate of a first conductivity type and a high doping concentration; depositing on said substrate an epitaxial layer of a second conductivity type and a second doping concentration lower than that of said substrate; and forming a first insulating layer on said epitaxial layer; wherein the improvement comprises the steps of:

(a) forming a second insulating layer on said first insulating layer which is preferentially etchable with respect to said first insulating layer and sufficiently thick to shorten the trajectory in the semiconductor of ions implanted through both said insulating layers by at least 5000Å with respect to those implanted through openings in the insulating layers;

(b) forming an isolation ring in the epitaxial layer sufficiently deep to contact said semiconductor substrate;

(c) etching a first opening through said first and second insulating layers after appropriate masking, and depositing therein doping impurities of the first conductivity type which are driven in to merge with said substrate and form a first region of the first conductivity type;

(d) etching a second opening through the second insulating layer after appropriate masking, and implanting doping impurities through the second opening and the first insulating layer to form second regions of the first conductivity type in the epitaxial layer spaced from said first regions and substrate;

(e) implanting a layer of said second conductivity type with deeper portions in said substrate corresponding to said first and second openings etched through both said first and second insulating layers during steps (c) and (d) and shallower portions in said eptaxial layer beneath said first and second insulating layers, the dosage and depth of said deeper portions being chosen to prevent a compensation of said substrate conductivity, said shallow portions producing a third region in said epitaxial layer within the boundaries outlined by said first and second regions and self-aligned with respect to them;

(f) heating said layer of said second conductivity type to increase the doping concentration of said epitaxial layer by upward diffusion of impurities from said shallow portion;

(g) forming ohmic contacts to said substrate, epitaxial layer and second regions to bias these regions as the complementary transistors of an MTL cell;

whereby a merged transistor logic device having localized regions of high and low emitter injection efficiency, can be fabricated with the same number of masks as in conventional processes and yet achieving self-alignment between said third region and said first and second regions.

2. In a process for fabricating a semiconductor device having localized regions of high and low injection efficiency, including the steps of selecting a semiconductor substrate of a first conductivity type and a high doping concentration; depositing on said substrate an epitaxial layer of a second conductivity type and a second doping concentration lower than that of said substrate forming a first insulating layer on said epitaxial layer; wherein the improvement comprises the steps of:

(a) forming a second insulating layer on said first insulating layer which is preferentially etchable with respect to said first insulating layer and having sufficient thickness to act as an ion-implantation blocking mask by itself and in conjunction with said first insulating layer;

(b) forming an isoltion ring in the epitaxial layer sufficiently deep to contact said semiconductor substrate;

(c) etching said first and second insulating layers after appropriate masking, to form ion-implantation and oxidation mask windows over those regions of said epitaxial layer where the lateral PNP emitter and collector regions and the vertical NPN extrinsic base regions will be respectively formed;

(d) implanting dopant ions through said windows opened in step (c) to form in said epitaxial layer a first region with a doping concentration of said second conductivity type which is higher than that of said epitaxial layer;

(e) heating said substrate to diffuse the doping impurities of said first region to increase the doping concentration of surrounding regions of said epitaxial layer and simultaneously growing a thick insulating layer over the exposed surface of said epitaxial layer;

(f) etching one of said masks formed during step (c) after appropriate masking to open a window and depositing therethrough doping impurities which are driven in to reach said substrate and form a second region of the first conductivity type constituting the base region of said lateral PNP which is self-aligned with respect to said first region, and simultaneously forming a thick insulating layer in the window;

(g) etching away the remaining masking regions to form windows and depositing therethrough doping impurities of the first conductivity type to form third regions to the first conductivity type in the epitaxial layer spaced from said substrate and said second region constituting the collector regions of said vertical PNP and self-aligned with respect to said first region;

(h) forming ohmic contacts to said substrate, epitaxial layer and third regions to bias these regions as the complementary transistors of an MTL cell;

whereby a merged transistor logic device having localized regions of high and low emitter injection efficiency, can be fabricated with the same number of masks as in conventional processes and yet achieving self-alignment between said third region and said first and second regions.

* * * * *